United States Patent [19]

Brockway et al.

[11] Patent Number: 5,373,133
[45] Date of Patent: Dec. 13, 1994

[54] EQUIPMENT UNIT LATCH AND ASSOCIATED SWITCH

[75] Inventors: Robert C. Brockway, Salem; Philip S. Dietz, East Hampstead; Lo C. Nguyen, Windham, all of N.H.

[73] Assignee: AT&T Corp., Murray Hill, N.J.

[21] Appl. No.: 38,036

[22] Filed: Mar. 29, 1993

Related U.S. Application Data

[63] Continuation of Ser. No. 767,306, Sep. 27, 1991, abandoned.

[51] Int. Cl.5 .......................... H01H 3/04; H01H 3/20
[52] U.S. Cl. .................................... 200/335; 200/292; 200/318; 200/321; 340/687; 361/759; 361/801
[58] Field of Search ............... 200/292, 318, 321, 322, 200/329, 335, 332, DIG. 6; 361/394, 395, 399, 412, 413, 415; 439/61, 62, 64; 211/41; 340/687; 324/158 R

[56] References Cited

U.S. PATENT DOCUMENTS

| | | |
|---|---|---|
| 4,071,722 | 1/1978 | Hart . |
| 4,596,907 | 6/1986 | La Greco et al. ............ 200/292 X |
| 4,614,389 | 9/1986 | Albert et al. ................ 339/45 |
| 4,798,923 | 1/1989 | Barwick et al. . |
| 4,835,737 | 5/1989 | Herrig et al. . |
| 4,914,550 | 4/1990 | Filsinger et al. ............ 361/415 X |
| 4,949,035 | 8/1990 | Palmer, II ................ 439/490 X |
| 4,952,758 | 8/1990 | Dara et al. ................ 200/51.09 |
| 4,967,312 | 10/1990 | Ozawa et al. ............ 361/395 X |
| 5,065,141 | 11/1991 | Whitsitt ................ 361/415 X |
| 5,191,970 | 3/1993 | Brockway et al. ............ 200/335 |

FOREIGN PATENT DOCUMENTS 0254456 1/1988 European Pat. Off. .
0313270 4/1989 European Pat. Off. .

Primary Examiner—Allan N. Shoap
Assistant Examiner—Jes F. Pascua
Attorney, Agent, or Firm—Thomas Stafford

[57] ABSTRACT

An equipment unit latch and an associated switch arrangement are advantageously employed to generate an action initiation signal upon initial movement of the latch toward physically removing the equipment from an equipment frame but prior to any movement of the equipment unit in an equipment frame in which it is inserted. The physical shape and dimensions of the latch and the spatial relationship of the associated switch arrangement to the latch are such that the latch is allowed to move a sufficient distance toward removing the equipment unit from the equipment frame, in order to activate the switch to generate the action initiation signal prior to any movement of the equipment unit in the equipment frame. In a specific embodiment of the invention, the switch includes a light emitter and a light detector. Light from the emitter is inhibited from reaching the detector by the latch when the equipment unit is fully inserted in the equipment frame and the latch is in a closed position. Upon movement of the latch, the light is no longer inhibited from being detected by the detector and the action initiation signal is generated after movement of the latch, but prior to any movement of the equipment unit toward being removed from the equipment frame.

12 Claims, 3 Drawing Sheets

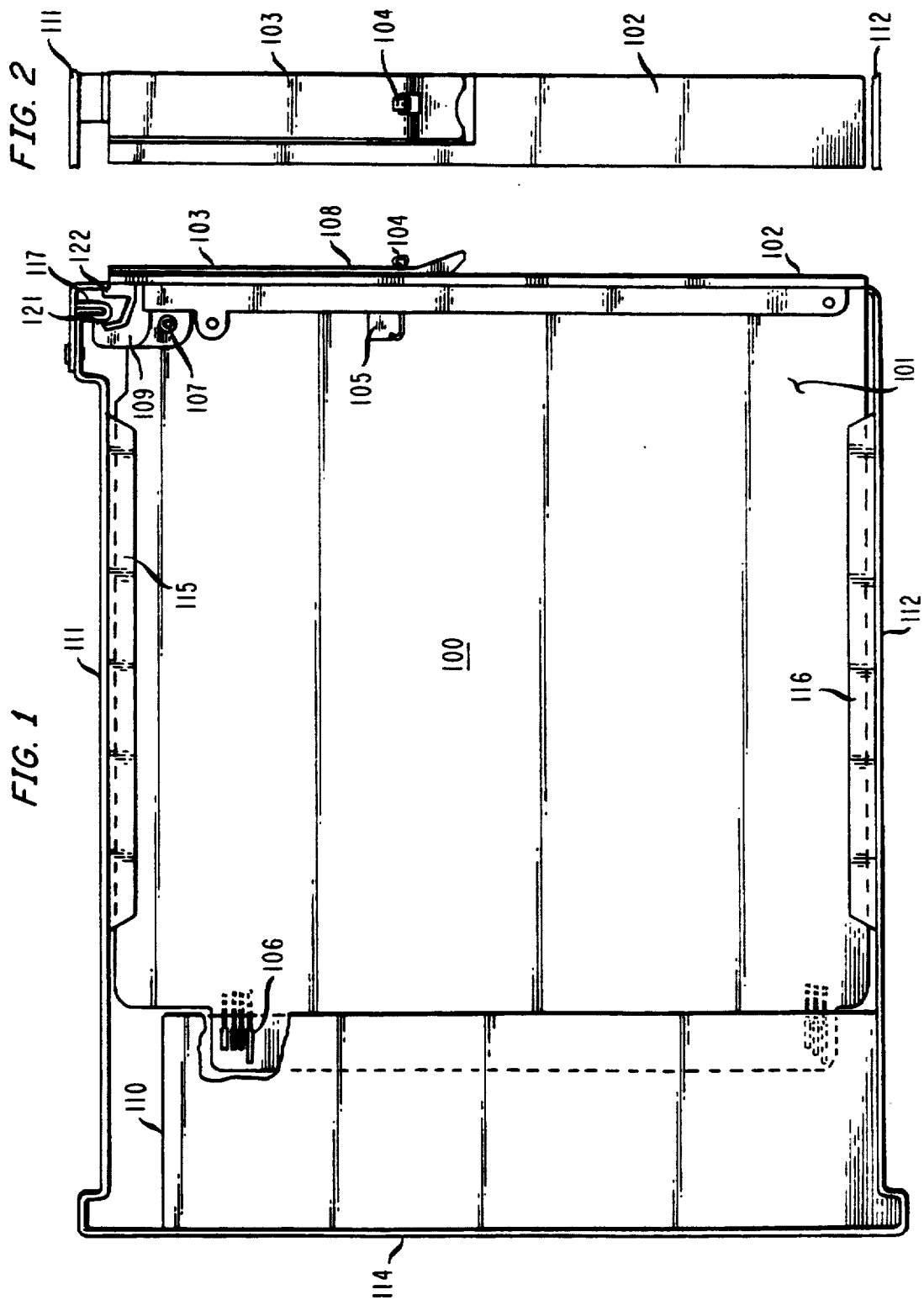

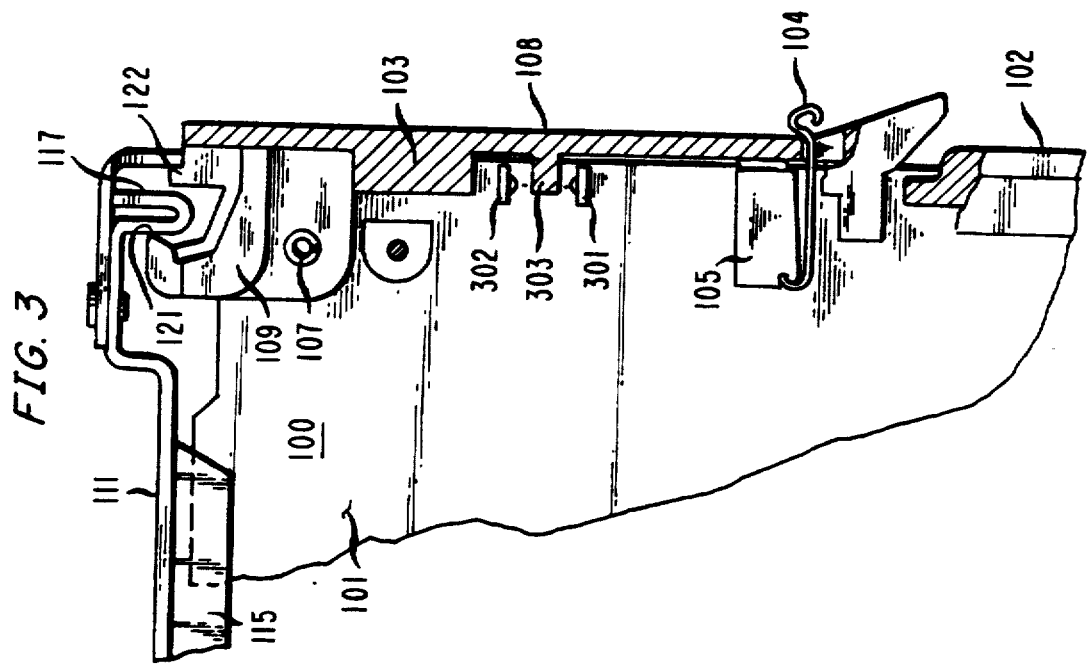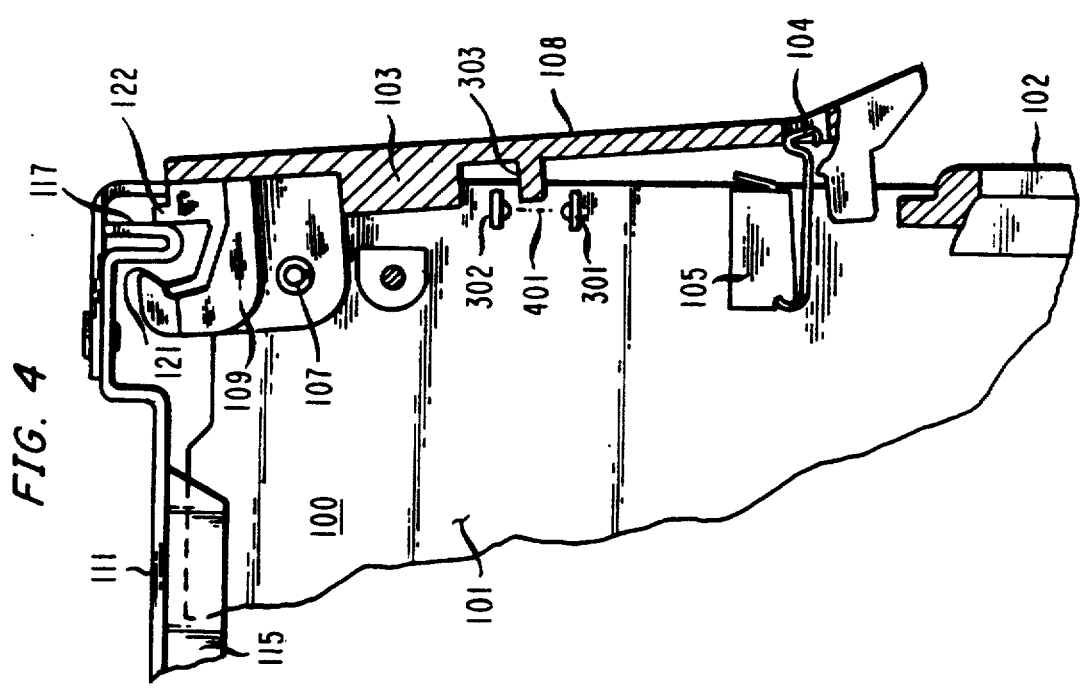

1

EQUIPMENT UNIT LATCH AND ASSOCIATED SWITCH

CROSS-REFERENCE TO RELATED APPLICATION

This application is a continuation of appication Ser. No. 07/767,306, field on Sep. 27, 1991, now abandoned.

TECHNICAL FIELD

This invention relates to an equipment unit and, more particularly, to a switch arrangement associated with the equipment unit.

BACKGROUND OF THE INVENTION

It has been the practice to provide a switch arrangement associated with an equipment unit, e.g., plug-in, circuit pack and the like, in order to initiate some action upon removal of the equipment unit from its connector in an equipment frame. Such known prior switch arrangements employed mechanical switches that were either mounted on the removable equipment unit itself, or on or about the equipment frame in which the equipment unit was inserted. Such switches are usually large in size, cumbersome and prone to mechanical failure. In any event, the equipment unit is typically required to be totally removed from its connector in the equipment frame, prior to the initiation of the action. In many applications, any movement of an equipment unit while in an operative or in-service state is undesirable. This is especially true in digital communication systems employing relatively high bit rates because any such movement of an in-service equipment unit will tend to cause transmission errors.

SUMMARY OF THE INVENTION

These and other problems and limitations of prior known equipment unit switch arrangements are overcome, in accordance with the invention, by employing a unique latch and associated switch arrangement.

The latch and switch are arranged such that an action initiation signal is obtained upon initial movement of the latch when beginning to remove the equipment unit but prior to any movement of the equipment unit in an equipment frame. This is realized by physically arranging the latch such that there is sufficient movement of the latch to cause a switch operation prior to any movement of the equipment unit in the equipment frame.

In a specific embodiment of the invention, a switch arrangement is placed on the equipment unit in a prescribed spatial relationship to a portion of the latch such that the removal initiation signal is generated upon the initial movement of the latch, but prior to any movement of the equipment unit in the equipment frame.

In a particular embodiment of the invention, the switch arrangement comprises a light sensor arrangement placed in a prescribed spatial relationship to the latch such that generation of the removal initiation signal is normally inhibited when the equipment unit is fully inserted in the equipment frame and is enabled upon initial movement of the latch when beginning the removal of the equipment unit, but prior to any movement of the equipment unit in the equipment frame.

More specifically, the light sensor arrangement of the embodiment comprises an infrared emitter and associated detector and wherein the latch is physically arranged to block the light from the infrared emitter being supplied to the detector when the latch is in a closed, i.e., inserted, position.

BRIEF DESCRIPTION OF THE DRAWING

In the drawing:

FIG. 1 is a cross section view of an equipment unit, including the invention, inserted in its connector in an equipment frame;

FIG. 2 is a front view of the equipment unit of FIG. 1;

FIG. 3 is a cut-away view of a portion of the equipment unit fully inserted in the equipment frame;

FIG. 4 is another cut-away view of a portion of the equipment unit about to be removed from the equipment frame;

DETAILED DESCRIPTION

Figure 5:
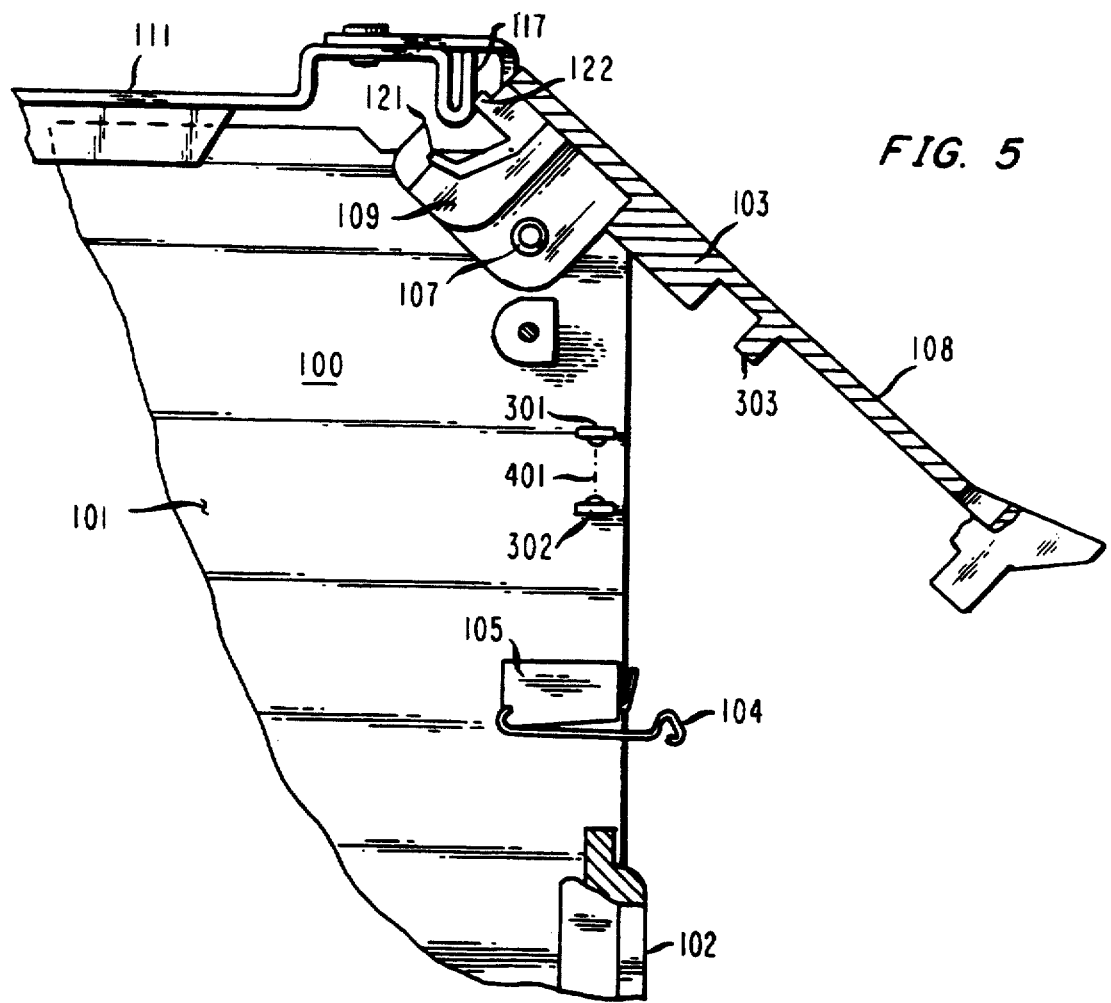
FIG. 5 is another cut-away view of the equipment unit being removed from or inserted into the equipment frame.

FIG. 1 shows a cross section view of equipment unit 100 which is fully inserted into an equipment frame. In this example, equipment unit 100 includes circuit board 101, face plate 102, latch 103, locking clip 104, and alignment block 105. Additionally, circuit board 101 includes at one end a plurality of contacts 106 adapted to be inserted into connector 110 in the equipment frame. Latch 103 is pivotally mounted to circuit board 101 at a pivot point via, for example, shoulder rivet 107. A switch arrangement associated with latch 103, in accordance with the invention, to be described herein below, is hidden from view by face plate 102. The equipment frame, in this example, is formed by upper shelf 111, lower shelf 112 and back 114 and is arranged to support one or more equipment units 100. A corresponding one or more connectors 110 are affixed to back 114 and lower shelf 112, as shown. Upper shelf 111 and lower shelf include circuit board guides 115 and 116, respectively, which are arranged to receive and guide circuit board 101 and its contacts 106 into its corresponding connector 110. Upper shelf 111 also includes U-channel 117 which is strategically placed relative to portions of latch 103, as described in detail herein below.

Latch 103 includes a first lever arm 108 for application of rotational force which is typically applied by a person's hand or finger. A second lever arm 109 is shown as being hook-shaped and includes so-called "cam-in" surface 121 and so-called "cam-out" surface 122. Cam-in surface 121 engages the rear surface of U-channel 117 when equipment unit 100 is being inserted into the equipment frame and cam-out surface 122 engages the front surface of U-channel 117 when equipment unit 100 is being extracted from the equipment frame. FIG. 1 shows the relative position of cam-in surface 121 and cam-out surface 122 when equipment unit 100 is fully inserted into the equipment frame. Again, as will be explained in detail below, the spatial placement of U-channel 117 in shelf 111 and the dimensional spacing between surfaces 121 and 122 are important to operation of latch 103 with an associated switch arrangement, in accordance with the invention.

Locking clip 104 is attached to alignment block 105 which, in turn, is mounted on circuit board 101. Locking clip 104 and alignment block 105 are arranged such as to affix latch 103 in place in a closed position when equipment unit 100 is fully inserted in the equipment frame. This is important to prevent inadvertent operation of the invention in generating an action initiation signal. Such inadvertent operation of the invention could possibly be caused by vibration and the like.

FIG. 2 shows a front view of equipment unit 100 inserted in the equipment frame. Elements which are identical to those shown in FIG. 1 have been similarly numbered and will not be described again.

FIG. 3 shows a cut-away view of a portion of equipment unit 100 fully inserted in the equipment frame. Elements identical to those described above in relation to FIG. 1 have been similarly numbered and are not described again in detail. Shown is a switch arrangement including, in this example, a light emitter 301 and light detector 302. In this embodiment, an infrared emitter and detector arrangement are advantageously employed. It is important to note that detector 302 must be placed in such a position so that spurious light or light other than from emitter 301 cannot be detected. Detection of such spurious light could cause generation of an inadvertent erroneous action initiation signal and is extremely undesirable. Latch 103 also includes so-called latch rib 303 that is physically dimensioned and is arranged, in this example, such that light emitted from emitter 301 is blocked, i.e., inhibited, from being detected by detector 302 when equipment unit 100 is fully inserted in the equipment frame and latch 103 is in a closed position. Again, the dimensions of U-channel 117, latch arm 109, cam-in surface 121, cam-out surface 122 and latch rib 303 are such that generation of an action initiation signal is inhibited when equipment unit 100 is fully inserted in the equipment frame. Note that the space between the inner surface of cam-out surface 122 and the front surface of U-channel 117 is such as to allow appropriate movement by lever arm 108 and, hence, latch rib 303 in order to allow light from emitter 301 to be detected by detector 302 prior to any movement of equipment unit 100 in the equipment frame, in accordance with the invention.

FIG. 4 depicts a cut-away view of a portion of equipment unit 100 about to be removed from the equipment frame. Again, elements identical to those described above relative to FIGS. 1 and 3 are similarly numbered and are not described again in detail. FIG. 4 clearly illustrates that the dimensions of and placement of U-channel 117 in shelf 111 of the equipment frame and the dimensions of level arm 109 including cam-in surface 121 and cam-out surface 122 are such as to allow sufficient movement of level arm 108 and, hence, latch rib 303, in order to generate, in accordance with the invention, an action initiation signal prior to movement of equipment unit 100 in the equipment frame. In this example, the action initiation signal is generated by detector 302 detecting light 401 emitted from emitter 301. Referring again to FIG. 3, the distance between the inner surface of cam-out surface 122 and the adjacent front surface of U-channel 117 is such as to allow the appropriate movement of latch level arm 108 and, hence, latch rib 303 so that the action initiation signal is generated prior to any movement of equipment unit 100 in the equipment frame.

FIG. 5 shows another cut-away view of the portion of equipment unit 100 in the equipment frame. Again, the individual elements shown in FIG. 5 which are identical to those described above relative to FIGS. 1, 3, and 4 have been similarly numbered and are not described again. FIG. 5 is included to illustrate the position of the elements of latch 103 relative to U-channel 117 in the equipment frame just prior to total removal of equipment unit 100 or alternatively just prior to being fully inserted in the equipment frame.

Figure 6:
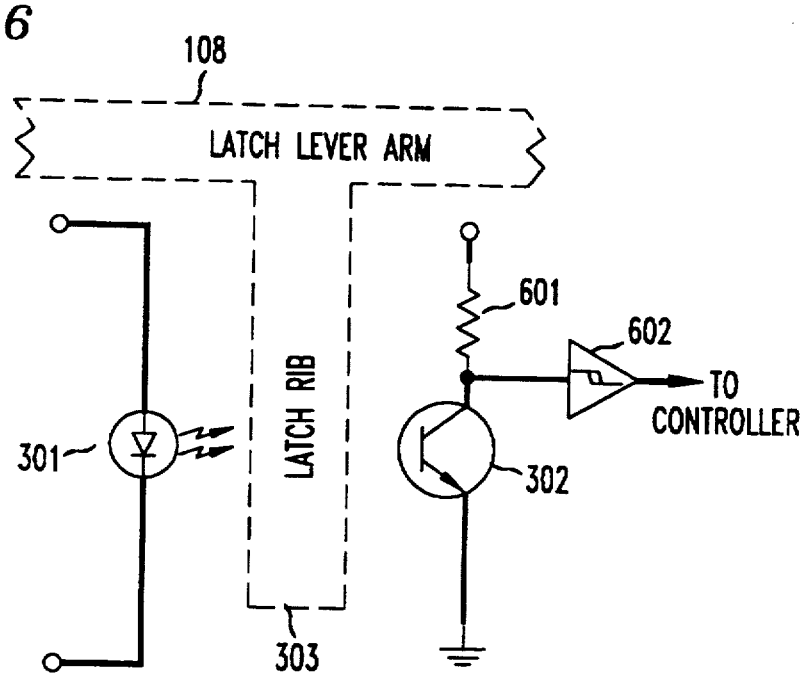
FIG. 6 shows, in simplified form, details of a portion of the latch and a circuit diagram of the associated switch arrangement.

FIG. 6 shows, in simplified form, details of a portion of the latch lever arm and a circuit diagram of the associated switch arrangement employed in this example to generate the action initiation signal, in accordance with the invention. Specifically, shown are a portion of latch lever arm 108 including latch rib 303, light emitter 301 and light detector 302. Light emitter 301 is connected, in this example, when equipment unit 100 is fully inserted into the equipment frame and its connector, to a power source in such a manner as to emit light (infrared) continuously, in well known fashion. Detector 302 is also connected to a source of potential via resistor 601 and to a reference potential, e.g., ground potential. Thus, detector 302 is arranged so that when it detects light from emitter 301, a potential transition step, i.e., the action initiation signal, is supplied as an output via buffer amplifier 602. Hysteresis is employed in the transfer function of buffer amplifier 602 to prevent so-called decision chatter as latch rib 303 moves through the cross-over point of detector 302. The action initiation signal is supplied, for example, to a controller or the like to effect a desired action. As indicated above the action initiation signal is generated when latch lever arm 108 and, hence, latch rib 303 is initially moved a sufficient distance to enable the light to pass from emitter 301 to detector 302, in accordance with the invention.

The above described arrangements are, of course, merely illustrative of the application of the principles of the invention. Other arrangements may be devised by those skilled in the art without departing from the spirit or scope of the invention. Specifically, it will be apparent that other positioning of light sensor arrangements may be employed. For example, an integral light emitter-detector arrangement could be used in which light from the emitter is normally reflected off a surface either on the latch or the circuit board and supplied to the detector. Then, an action initiation signal would be generated by movement of the latch causing the light from the emitter not to be supplied to the detector. Additionally, in other applications a mechanical switch, magnetic switch, Hall effect or the like switch could equally be enabled and disabled by movement of the latch. It will also be apparent that the switch arrangements could be placed at other locations on the circuit or equipment frame to realize the generation of the desired action initiation signal. Again, it is important to note that in any of these additional examples, the generation of the action initiation signal must occur at an appropriate instant after movement of the latch but prior to any movement of the equipment unit in the equipment frame, in accordance with the invention.

We claim:

1. An equipment unit to be inserted into a connector in an equipment frame comprising:
    a circuit board having a contact section intended to be inserted into the connector in the equipment frame; and
    a latch pivotally mounted to the circuit board at a pivot point for securing the equipment unit in the equipment frame;
    the equipment unit being CHARACTERIZED BY,
    said latch having a first lever arm and a second lever arm, the first lever arm extending from the pivot point in a first direction and the second lever arm extending from the pivot point in a second direction, the first lever arm being used for application of a first force for causing rotational movement of the latch about the pivot point, when the first force is applied to the first lever arm in a direction toward inserting the equipment unit in the equipment frame the first lever arm is in a closed position when a circuit board contact section is fully inserted in the connector, the second lever arm having a cam out surface for applying a force toward removal of the circuit board contact section from the connector in the equipment frame when the circuit board contact section is inserted in the connector and when the first force is applied to the first lever arm in a direction toward removing the circuit board contact section from the connector, the cam out surface being arranged such as to allow initial movement of the first lever arm from the closed position prior to applying the second force toward removing the equipment unit from the equipment frame so that the first lever arm of the latch is allowed to move freely prior to the cam out surface applying the second force toward removing the circuit board contact section from the connector in the equipment frame, and light responsive switch means mounted on said circuit board and associated with said latch and being responsive to said initial movement of said latch for generating an action initiation signal when said latch is initially moved in initiation of removal of said equipment unit from the equipment frame, and prior to any movement of the circuit board contact section in the connector.

2. An equipment unit as defined in claim 1 wherein said latch is positioned to disable said light responsive switch means from generating said action initiation signal when the equipment unit is fully inserted in the equipment frame and said latch is in a closed position.

3. An equipment unit as defined in claim 2 wherein said light responsive switch means includes a light emitter and a light detector.

4. An equipment unit as defined in claim 3 wherein said light responsive switch means further includes an amplifier in circuit with said light detector for supplying said action initiation signal as an output, said amplifier having a transfer function employing hysteresis.

5. An equipment unit as defined in claim 3 wherein said light emitter comprises an infrared light emitter and said light detector comprises an infrared light detector.

6. An equipment unit as defined in claim 2 wherein said first lever arm includes a protruding member which inhibits generation of said action initiation signal when said latch is in the closed position.

7. An equipment unit as defined in claim 6 wherein said light responsive switch means includes a light emitter and a light detector.

8. An equipment unit as defined in claim 7 wherein said light responsive switch means further includes an amplifier in circuit with said light detector for supplying said action initiation signal as an output, said amplifier having a transfer function employing hysteresis.

9. An equipment unit as defined in claim 7 wherein said light emitter comprises an infrared light emitter and said light detector comprises an infrared light detector.

10. An equipment unit as defined in claim 7 wherein said light emitter and said light detector are mounted on the circuit board in prescribed spatial alignment relationship to each other and to said first lever arm of said latch and wherein said protruding member of said first lever arm of said latch is positioned to inhibit light being emitted from said light emitter from reaching said light detector when the equipment unit is fully inserted in the equipment frame and the latch is in a closed position and such that said light detector is able to detect light from said light emitter upon the first lever arm of said latch initially moving a prescribed distance upon initiation of removal of the equipment unit from the equipment frame, and prior to any movement of the equipment unit in the equipment frame.

11. An equipment unit as defined in claim 10 wherein said protruding member of said first lever arm comprises a protruding element having prescribed dimensions and being such as to be positioned between said light emitter and said light detector when said latch is in a closed position to inhibit light emitted by said light emitter from reaching said light detector when the equipment unit is fully inserted in the equipment frame and the latch is in a closed position and such that said light detector is enabled to detect light from said light emitter upon the protruding element of the first lever arm of said latch moving a prescribed distance upon initiation of removal of the equipment unit from the equipment frame, and prior to any movement of the equipment unit in the equipment frame.

12. An equipment unit to be inserted into a connector in an equipment frame comprising:
a circuit board having a contact section intended to be inserted into the connector in the equipment frame;
a latch pivotally mounted to the circuit board at a pivot point for securing the equipment unit in the equipment frame;
means for generating light along a predetermined path; and
means aligned with said path in such a manner as to receive said light;
said latch having a first lever arm and a second lever arm, the first lever arm extending from the pivot point in a first direction and the second lever arm extending from the pivot point in a second direction, the first lever arm being used for application of a first force for causing rotational movement of the latch about the pivot point, when the first force is applied to the first lever arm in a direction toward inserting the equipment unit in the equipment frame the first lever arm is in a closed position when the circuit board contact section is inserted in the connector, the second lever arm having a cam out surface for applying a force toward removal of the circuit board contact section from the connector in the equipment frame when the circuit board contact section is inserted in the connector and when the first force is applied to the first lever arm in a direction toward removing the circuit board contact section from the connector, the cam out surface being arranged such as to allow initial movement of the first lever arm from the closed position prior to applying the second force toward removing the equipment unit from the equipment frame so that the first lever arm of the latch is allowed to move freely prior to the cam out surface applying the second force toward removing the circuit board contact section from the connector in the equipment frame, and said first lever arm of said latch including a blocking element disposed on said first lever arm of said latch in such a manner that said path is blocked when said equipment unit has been inserted into said equipment frame and becomes unblocked when said latch is moved in initiation of removal of said equipment unit from the equipment frame, and prior to any movement of the circuit board contact section in the connector.

* * * * *